United States Patent
Shrestha (10) Patent No.: US 9,679,823 B2
(45) Date of Patent: Jun. 13, 2017

(54) METRIC FOR RECOGNIZING CORRECT LIBRARY SPECTRUM

(71) Applicant: Applied Materials, Inc., Santa Clara, CA (US)

(72) Inventor: Kiran Lall Shrestha, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1112 days.

(21) Appl. No.: 13/840,554

(22) Filed: Mar. 15, 2013

(65) Prior Publication Data
US 2014/0273296 A1    Sep. 18, 2014

(51) Int. Cl.
| | | |
|---|---|---|
| B24B 51/00 | (2006.01) |
| H01L 21/66 | (2006.01) |
| B24B 37/005 | (2012.01) |
| B24B 49/12 | (2006.01) |

(52) U.S. Cl.
CPC ............ *H01L 22/26* (2013.01); *B24B 37/005* (2013.01); *B24B 49/12* (2013.01); *H01L 22/12* (2013.01)

(58) Field of Classification Search
CPC .................. G05B 19/418; G05B 15/02; G05B 2219/45232; G05B 2219/31459; G05B 23/0208; G05B 2219/45031
USPC ......................................... 700/164, 160, 121
See application file for complete search history.

(56) References Cited

U.S. PATENT DOCUMENTS

| | | | | |
|---|---|---|---|---|
| 5,394,520 | A | * | 2/1995 | Hall ...................... G01S 3/7864 345/566 |
| 2007/0042675 | A1 | | 2/2007 | Benvegnu et al. |
| 2008/0243433 | A1 | * | 10/2008 | Ravid .................. G01N 21/253 702/170 |
| 2010/0056023 | A1 | * | 3/2010 | David ................... B24B 37/005 451/5 |
| 2010/0114532 | A1 | | 5/2010 | David et al. |
| 2010/0217430 | A1 | | 8/2010 | David et al. |
| 2012/0034845 | A1 | | 2/2012 | Hu et al. |
| 2012/0100781 | A1 | * | 4/2012 | Zhang ..................... B24B 49/12 451/6 |
| 2012/0278028 | A1 | | 11/2012 | David et al. |
| 2014/0141694 | A1 | * | 5/2014 | Zhang ..................... B24B 49/12 451/5 |

* cited by examiner

*Primary Examiner* — Robert Fennema
*Assistant Examiner* — Jay Jung
(74) *Attorney, Agent, or Firm* — Fish & Richardson P.C.

(57) ABSTRACT

A method of controlling polishing of a substrate is described. A controller stores a library having a plurality of reference spectra. The controller polishes a substrate and measures a sequence of spectra of light from the substrate during polishing. For each measured spectrum of the sequence of spectra, the controller finds a best matching reference spectrum from the plurality of reference spectra and generates a sequence of best matching reference spectra. The controller uses a cell counting technique for finding the best matching reference spectrum. The controller determines at least one of a polishing endpoint or an adjustment for a polishing rate based on the sequence of best matching reference spectra.

18 Claims, 7 Drawing Sheets

METRIC FOR RECOGNIZING CORRECT LIBRARY SPECTRUM

TECHNICAL FIELD

The present disclosure relates to optical monitoring, e.g., for control of chemical mechanical polishing of substrates.

BACKGROUND

An integrated circuit is typically formed on a substrate by the sequential deposition of conductive, semiconductive, or insulative layers on a silicon wafer. A variety of fabrication processes require planarization of a layer on the substrate. For example, one fabrication step involves depositing a filler layer over a non-planar surface and planarizing the filler layer. For certain applications, the filler layer is planarized until the top surface of a patterned layer is exposed. For example, a metal layer can be deposited on a patterned insulative layer to fill the trenches and holes in the insulative layer. After planarization, the remaining portions of the metal in the trenches and holes of the patterned layer form vias, plugs, and lines and provide conductive paths between thin film circuits on the substrate. In other applications, such as oxide polishing, the filler layer is planarized until a predetermined thickness is left over the non-planar surface. In addition, planarization of the substrate surface is usually required prior to photolithography.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the substrate to push it against the polishing pad. Polishing slurry with abrasive particles is typically supplied to the surface of the polishing pad.

One problem in CMP is determining whether the polishing process is complete, i.e., whether a substrate layer has been planarized to a desired flatness or thickness, or when a desired amount of material has been removed. Variations in the slurry composition, the polishing pad condition, the relative speed between the polishing pad and the substrate, the initial thickness of the substrate layer, and the load on the substrate can cause variations in the material removal rate. These variations cause variations in the time needed to reach the polishing endpoint. Therefore, determining the polishing endpoint merely as a function of polishing time can lead to non-uniformity within a wafer or from wafer to wafer.

In some systems, a substrate is optically monitored in-situ during polishing, e.g., through a window in the polishing pad. However, existing optical monitoring techniques may not satisfy increasing demands of semiconductor device manufacturers.

SUMMARY

In some in-situ optical monitoring processes, a spectrum is measured from a substrate during polishing. The spectrum is compared to a plurality of reference spectra from a library, and the best matching reference spectrum is identified. One technique for identifying the best matching reference spectrum is to determine a difference between the measured spectrum and each reference spectrum, and identify the reference spectrum with the least difference. For example, a sum of squared differences algorithm can be used.

Without being limited to any particular theory, some distance metrics, such as the sum of squared differences, may be highly sensitive to the position of peaks in the spectra, and variations in the thickness of an underlying layer may cause shifts in the positions of the peaks of the measured spectra. In another respect, a matching algorithm that uses the sum of squared differences for finding a matching reference spectrum might be sensitive to noise. Such a matching algorithm may not be reliable and may prone to provide a false result. However, it may be possible to reduce or avoid these problems if another technique, such as a dissimilarity ratio based on a cell counting technique, is used for identifying the best matching reference spectrum.

In one aspect a method of controlling polishing includes storing a library having a plurality of reference spectra and polishing a substrate and measuring a sequence of spectra of light from the substrate during polishing. For each measured spectrum of the sequence of spectra, a best matching reference spectrum is found from the plurality of reference spectra to generate a sequence of best matching reference spectra, where finding the best matching reference spectrum uses a cell counting technique. At least one of a polishing endpoint or an adjustment for a polishing rate is determined based on the sequence of best matching reference spectra.

In another aspect, a polishing apparatus includes a support to hold a polishing pad, a carrier head to hold a substrate against the polishing pad, a motor to generate relative motion between the carrier head and the support to polish the substrate, an optical monitoring system to measure a sequence of spectra of light from the substrate while the substrate is being polished, and a controller configured to store a library having a plurality of reference spectra. Each reference spectrum of the plurality of reference spectra has a stored associated characterizing value. For each measured spectrum of the sequence of spectra, using a cell counting technique, a best matching reference spectrum is found and at least one of a polishing endpoint or an adjustment for a polishing rate based on the sequence of best matching reference spectra is determined.

In another aspect, a computer program product, tangibly embodied in a machine readable storage device, includes instructions to store a library having a plurality of reference spectra, polish a substrate, measure a sequence of spectra of light from the substrate during polishing. For each measured spectrum of the sequence of spectra, using a cell counting technique, a best matching reference spectrum is found and at least one of a polishing endpoint or an adjustment for a polishing rate based on the sequence of best matching reference spectra is determined.

Implementations may include one or more of the following features. The cell counting technique may include dividing a spectral space into a number of cells, counting crossing cells, where a crossing cell contains at least one point of the reference spectrum and/or the measured spectrum. The cell counting technique may include counting separating cells, where separating cells are located in enclosures between the crossing cells. The cell counting technique may include determining a dissimilarity value, where the dissimilarity value is a ratio of a number of separating cells to a sum of the number of separating cells and a number of crossing cells, and finding a reference spectrum with a lowest dissimilarity value as the best matching reference spectrum.

Dividing the spectral space of wavelength and intensity into a number of cells may include normalizing the reference spectra and the measured spectrum, selecting a wavelength range, where the matching is performed in the selected wavelength range, dividing the selected wavelength range into a first number of non-overlapping subranges and dividing a normalized intensity range into a second number of non-overlapping subranges. Each cell may correspond to a different combination of a subrange of the selected wavelength range from the first number of subranges and a subrange of the normalized intensity from the second number of subranges.

Counting the separating cells may include searching corresponding cells of each wavelength subrange of the first number of subranges and determining separating cells of each wavelength subrange, where the corresponding cells of each wavelength subrange are the cells having a same wavelength subrange. The search includes determining one or more of the crossing cells of the wavelength subrange containing at least one point of the reference spectrum and/or the measured spectrum, and designating the separating cells of the wavelength subrange. The separating cells of the wavelength subrange are enclosed between the crossing cells, where there is at least one crossing cell above and at least one crossing cell below the separating cells.

Finding the best matching reference spectrum includes generating a sequence of dissimilarity values for the reference spectra and fitting a curve to the sequence of dissimilarity values and determining a minimum of the fitted curve, where a reference spectrum with a dissimilarity value closest to the minimum of the fitted curve is the best matching reference spectrum.

Implementations may include one or more of the following advantages. When the peaks of different measured spectra change due to variations in underlying layers caused by upstream process variations, the enclosed area between the reference spectrum and the measured spectrum may not considerably change. Therefore, the result of using the cell counting techniques for finding a matching reference spectrum can be less sensitive to positions of the peaks in the measured spectra, thereby reducing sensitivity of the matching algorithm to upstream process variations. Additionally, the dissimilarity ratio based on cell counting technique is sharp around its minimum and the result might be more reliable. It is also more effective from computational point of view. Reliability of the endpoint system to detect a desired polishing endpoint can be improved, and within-wafer and wafer-to-wafer thickness non-uniformity (WI-WNU and WTWNU) can be reduced.

The details of one or more implementations are set forth in the accompanying drawings and the description below. Other aspects, features, and advantages will be apparent from the description and drawings, and from the claims.

BRIEF DESCRIPTION OF THE DRAWINGS

Like reference numbers and designations in the various drawings indicate like elements.

DETAILED DESCRIPTION

One optical monitoring technique for controlling a polishing operation is to measure a spectrum of light reflected from a substrate, either in-situ during polishing or at an in-line or in-sequence metrology station, and compare the measured spectrum to a plurality of reference spectra from a library, and identify a best matching reference spectrum. It is possible to define and measure the dissimilarity between two spectrums and determine a dissimilarity value between the measured spectrum and each spectrum in the library of reference spectra. The reference spectrum with the least dissimilarity value is the best matched reference spectrum to the measured spectrum.

One potential problem is the reliability of the least dissimilarity value. The measured spectrum is sensitive to the thickness of the underlying layers. Because of within-wafer and wafer-to-wafer process non-uniformity, the measured spectrum varies when measured at different points of a same wafer or on more than one wafer. The measured spectrum variations, although may not be significant, may cause variations in dissimilarity values. It may be possible to define a dissimilarity measure that when comparing a measured spectrum with the reference spectra generates a sequence of dissimilarity values with sharpness around its minimum, thereby increasing the reliability of finding the best matched reference spectrum in presence of variations in underlying layers or measurement noise, and reducing the possibility of false matches.

Figure 1:
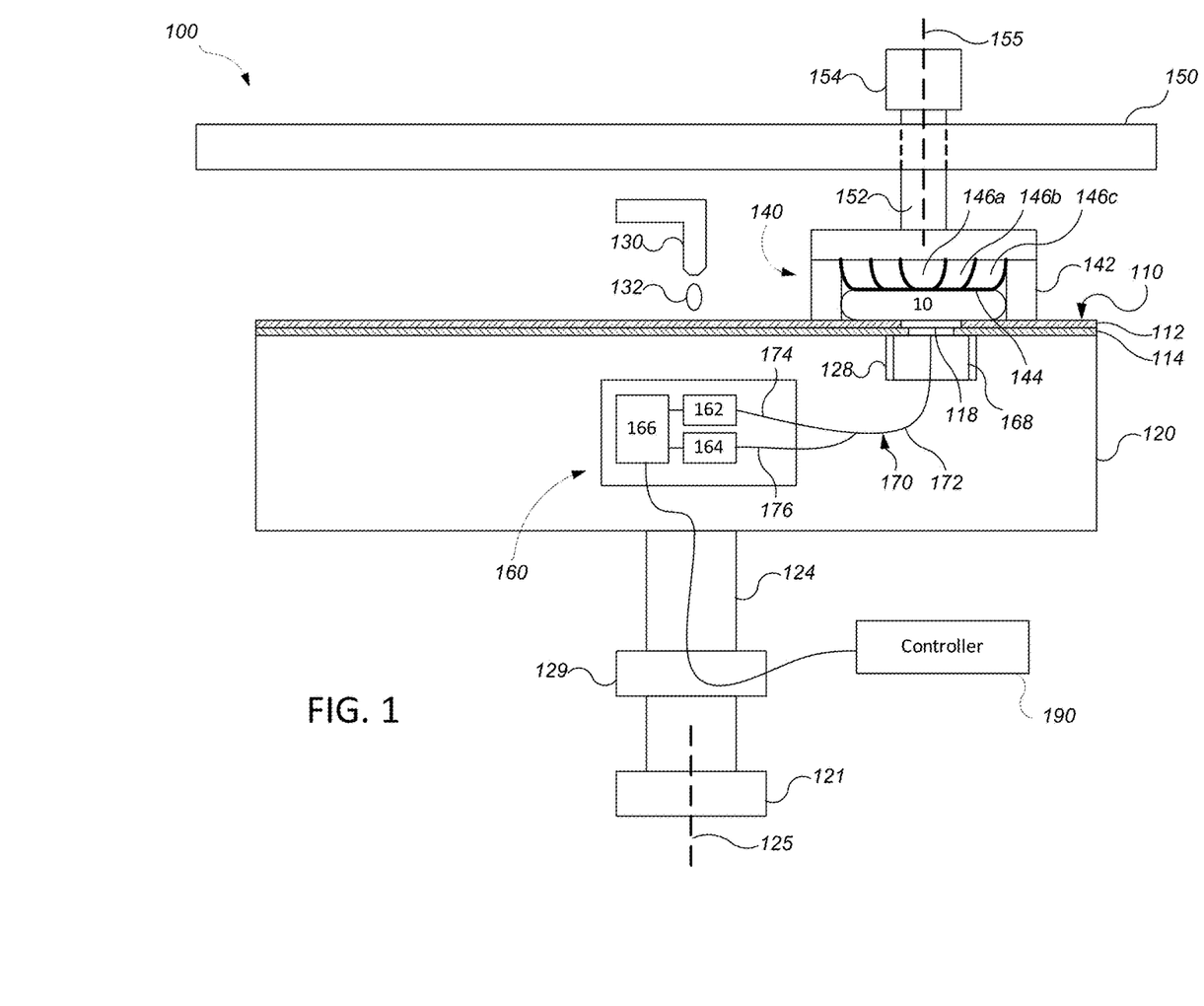
FIG. 1 illustrates a schematic cross-sectional view of an example of a polishing apparatus.

FIG. 1 illustrates an example of a polishing apparatus 100. The polishing apparatus 100 includes a rotatable disk-shaped platen 120 on which a polishing pad 110 is situated. The platen is operable to rotate about an axis 125. For example, a motor 121 can turn a drive shaft 124 to rotate the platen 120. The polishing pad 110 can be a two-layer polishing pad with an outer polishing layer 112 and a softer backing layer 114.

The polishing apparatus 100 can include a port 130 to dispense polishing liquid 132, such as slurry, onto the polishing pad 110.

The polishing apparatus 100 includes at least one carrier head 140. The carrier head 140 is operable to hold a substrate 10 against the polishing pad 110. The carrier head 140 can have independent control of the polishing parameters, for example pressure, associated with each respective substrate.

In particular, the carrier head 140 can include a retaining ring 142 to retain the substrate 10 below a flexible membrane 144. The carrier head 140 also includes a plurality of independently controllable pressurizable chambers defined by the membrane, e.g., three chambers 146a-146c, which can apply independently controllable pressures to associated zones on the flexible membrane 144 and thus on the substrate 10. Although only three chambers are illustrated in FIG. 1 for ease of illustration, there could be one or two chambers, or four or more chambers, e.g., five chambers.

The carrier head 140 is suspended from a support structure 150, e.g., a carousel or a track, and is connected by a drive shaft 152 to a carrier head rotation motor 154 so that the carrier head can rotate about an axis 155. Optionally the carrier head 140 can oscillate laterally, e.g., on sliders on the carousel or track 150; or by rotational oscillation of the carousel itself. In operation, the platen is rotated about its central axis 125, and the carrier head is rotated about its central axis 155 and translated laterally across the top surface of the polishing pad.

While only one carrier head 140 is shown, more carrier heads can be provided to hold additional substrates so that the surface area of polishing pad 110 may be used efficiently.

The polishing apparatus also includes an in-situ monitoring system 160. The in-situ monitoring system generates a time-varying sequence of values that depend on the thickness of a layer on the substrate. The in-situ-monitoring system 160 is an optical monitoring system. In particular, the in-situ-monitoring system 160 measures a sequence of spectra of light reflected from a substrate during polishing. For each measured spectrum, a matching reference spectrum from a library of reference spectra is identified. Each reference spectrum in the library can have an associated characterizing value, e.g., a thickness value or a characterizing value indicating the time or number of platen rotations at which the reference spectrum is expected to occur. By determining the associated characterizing value for each matching reference spectrum, a time-varying sequence of characterizing values can be generated.

An optical access through the polishing pad can be provided by including an aperture (i.e., a hole that runs through the pad) or a solid window 118. The solid window 118 can be secured to the polishing pad 110, e.g., as a plug that fills an aperture in the polishing pad, e.g., is molded to or adhesively secured to the polishing pad, although in some implementations the solid window can be supported on the platen 120 and project into an aperture in the polishing pad.

The optical monitoring system 160 can include a light source 162, a light detector 164, and circuitry 166 for sending and receiving signals between a remote controller 190, e.g., a computer, and the light source 162 and light detector 164. One or more optical fibers can be used to transmit the light from the light source 162 to the optical access in the polishing pad, and to transmit light reflected from the substrate 10 to the detector 164. For example, a bifurcated optical fiber 170 can be used to transmit the light from the light source 162 to the substrate 10 and back to the detector 164. The bifurcated optical fiber can include a trunk 172 positioned in proximity to the optical access, and two branches 174 and 176 connected to the light source 162 and detector 164, respectively.

In some implementations, the top surface of the platen can include a recess 128 into which is fit an optical head 168 that holds one end of the trunk 172 of the bifurcated fiber. The optical head 168 can include a mechanism to adjust the vertical distance between the top of the trunk 172 and the solid window 118.

The output of the circuitry 166 can be a digital electronic signal that passes through a rotary coupler 129, e.g., a slip ring, in the drive shaft 124 to the controller 190 for the optical monitoring system. Similarly, the light source can be turned on or off in response to control commands in digital electronic signals that pass from the controller 190 through the rotary coupler 129 to the optical monitoring system 160. Alternatively, the circuitry 166 could communicate with the controller 190 by a wireless signal.

Figures 2, 3:
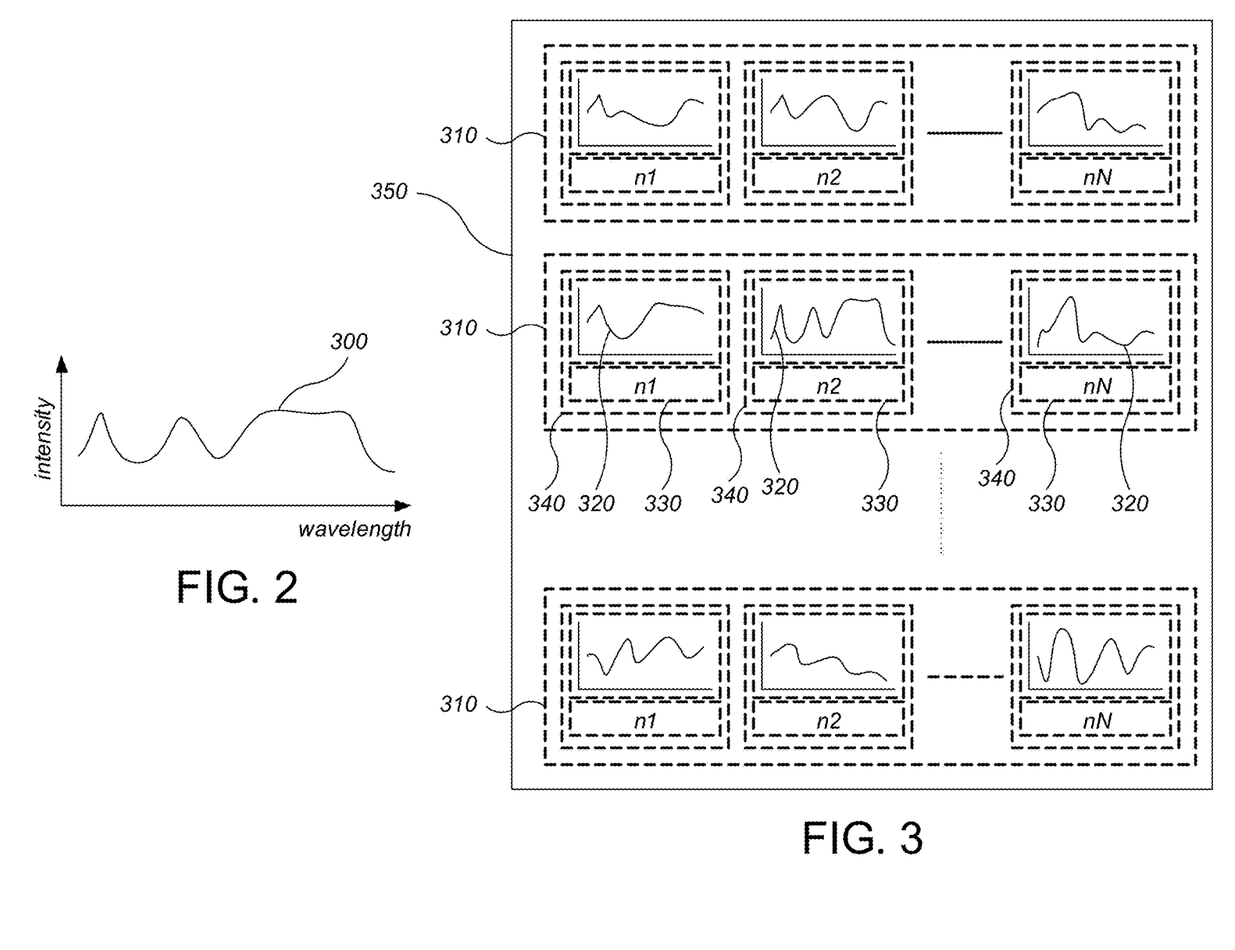
FIG. 2 illustrates a measured spectrum from the in-situ optical monitoring system.
FIG. 3 illustrates a library of reference spectra.

The light source 162 can be operable to emit ultraviolet (UV), visible or near-infrared (NIR) light. The light detector 164 can be a spectrometer. A spectrometer is an optical instrument for measuring intensity of light over a portion of the electromagnetic spectrum. A suitable spectrometer is a grating spectrometer. Typical output for a spectrometer is the intensity of the light as a function of wavelength (or frequency). FIG. 2 illustrates an example of a measured spectrum 300 with intensity as a function of wavelength.

As noted above, the light source 162 and light detector 164 can be connected to a computing device, e.g., the controller 190, operable to control their operation and receive their signals. The computing device can include a microprocessor situated near the polishing apparatus. For example, the computing device can be a programmable computer. With respect to control, the computing device can, for example, synchronize activation of the light source with the rotation of the platen 120.

The optical monitoring system 160 is configured to generate a sequence of measured spectra at a measurement frequency. In some implementations, the light source 162 and detector 164 of the in-situ monitoring system 160 are installed in and rotate with the platen 120. In this case, the measurement frequency can be once per rotation of the platen. It is possible for multiple spectra to be obtained as the optical access passes below the substrate 10, in which case one of the obtained spectra can be selected, or multiple obtained spectra can be combined, to provide the measured spectra.

In operation, the controller 190 can receive, for example, a signal that carries information describing a spectrum of the light received by the light detector for a particular flash of the light source or time frame of the detector. Thus, this spectrum is a spectrum measured in-situ during polishing.

Without being limited to any particular theory, the spectrum of light reflected from the substrate 10 evolves as polishing progresses (e.g., over multiple rotations of the platen, not during a single sweep across the substrate) due to changes in the thickness of the outermost layer, thus yielding a sequence of time-varying spectra. Moreover, particular spectra are exhibited by particular thicknesses of the layer stack.

Referring to FIGS. 2 and 3, during polishing, a measured spectrum 300 can be compared to reference spectra 320 from a library 310 of reference spectra. The library 310 of reference spectra 320 can be stored in a database 350.

In some implementations, the database 350 can store a plurality of libraries 310 of reference spectra 320. In this case, each library of reference spectra can be a collection of reference spectra which represent substrates that share a property in common. However, the property shared in common in a single library may vary across multiple libraries of reference spectra. For example, two different libraries can include reference spectra that represent substrates with two different underlying thicknesses. For a given library of reference spectra, variations in the upper layer thickness, rather than other factors (such as differences in wafer pattern, underlying layer thickness, or layer composition), can be primarily responsible for the differences in the spectral intensities.

Reference spectra 320 for different libraries 310 can be generated by polishing multiple "set-up" substrates, e.g., substrates with different substrate properties (e.g., underlying layer thicknesses, or layer composition), and collecting spectra as discussed above. The spectra from a first set-up substrate can provide a first library, the spectra from a second set-up substrate can provide a second library, and the spectra from a third set-up substrate can provide a third library. Alternatively, reference spectra can be calculated from theory, e.g., an optical model can be used to calculate a reference spectrum for a given layer stack.

In general, each library 310 can include many reference spectra 320. For example, each library 310 can include one or more, e.g., exactly one, reference spectra for each platen rotation over the expected polishing time of the substrate.

In some implementations, each reference spectrum 320 is assigned a characterizing value 330, e.g., a thickness value or an index value. The index value can be a number of platen rotations or a time at which the associated spectrum would be expected to appear. The spectra can be indexed so that each spectrum in a particular library has a unique index value. The indexing can be implemented so that the index values are sequenced in an order in which the spectra were measured. An index value for the reference spectra in a library can be selected to change monotonically, e.g., increase or decrease, as polishing progresses. In particular, the index values of the reference spectra can be selected so that they form a linear function of time or number of platen rotations (assuming that the polishing rate follows that of the model or test substrate used to generate the reference spectra in the library). For example, the index value can be proportional, e.g., equal, to a number of platen rotations at which the reference spectra was measured for the test substrate or would appear in the optical model. Thus, each index value can be a whole number.

The reference spectra and their associated characterizing values can be stored in a reference library. For example, each reference spectrum 320 and its associated characterizing value 330 can be stored in a record 340 of database 350. The database 350 of reference libraries of reference spectra can be implemented in memory of the computing device of the polishing apparatus.

In some implementations, multiple potential libraries of potential reference spectra can be generated automatically from a lot of set-up substrates, and one of the potential libraries can be selected as the library 310 of reference spectra 320 to use for the endpoint detection and/or process control of a later device substrate.

As noted above, for each measured spectrum, a matching reference spectrum from a library 310 of reference spectra 320 is identified and an associated characterizing value is obtained.

Figure 4:
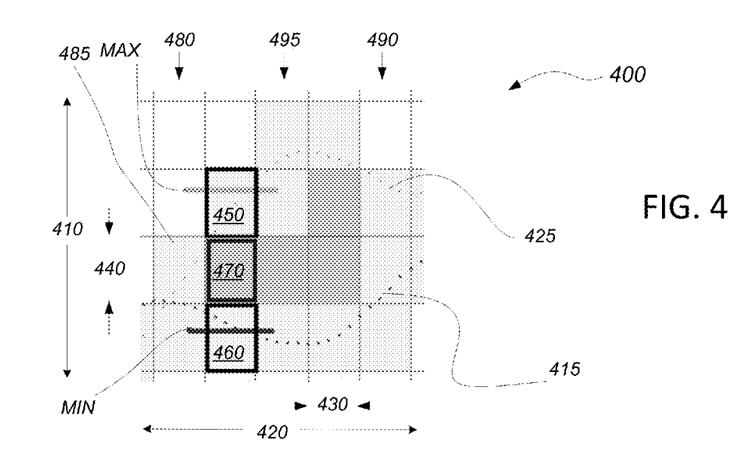
FIG. 4 illustrates a spectral space of wavelength and intensity that is divided into cells.

FIG. 4 illustrates an example spectral space 400 of wavelength (on the horizontal axis) and intensity (on the vertical axis) divided into a number of cells for example the cells 450-470. The wavelength range 420 is divided into a number of equal wavelength subranges 430 and the intensity range 410 is divided into a number equal intensity subranges 440. Every combination of a wavelength subrange and an intensity subrange corresponds to a different cell of the spectral space of wavelength and intensity. The example spectral space 400 shows 20 cells, but this is just illustrative. There can be 20 to 200 intensity subranges, e.g., 100 intensity subranges, and 20 to 100 wavelength subranges, e.g., 100 wavelength subranges. In addition, the cells, e.g., 450-470, need not be of uniform size—although uniform size can be easier to implement in software. The spectral space 400 also shows a reference spectrum 415 and measured spectrum 425.

To perform a cell counting technique, the cells through which either the reference spectrum or the measured spectrum passes are counted, and the cells that are between the reference spectrum and the measured spectrum (but through which the reference spectrum and the measured spectrum do not pass) are also counted.

The reference spectrum 415 can be represented as a set of points, e.g., pairs of wavelength and intensity values. Similarly, the measured spectrum 425 can be represented as a set of points, e.g., pairs of wavelength and intensity values. A cell that includes one or more of the points of the reference spectrum and/or the measured spectrum is identified a crossing cell (the crossing cells are shown with light shading). For example, crossing cell 450 includes a point of the reference spectrum, crossing cell 460 includes a point of the measured spectrum, and crossing cell 485 includes a point of the reference spectrum and the measured spectrum.

Each cell that is in the enclosure of the measured spectrum 425 and the reference spectrum 415 (but does not include any points of reference spectrum and/or measured spectrum) is a separating cell 470 (the separating cells are shown with darker shading). In each column of the cells of the spectral space 400, there can be one or more crossing cells; all the cells between the crossing cells are the separating cells.

One implementation to determine the separating cells is, for each column of cells, to determine a maximum intensity MAX and a minimum intensity MIN of any of the points in the column (regardless of whether the points are from the reference spectrum or the measured spectrum). The cells that contain the points with the maximum intensity MAX and the minimum intensity MIN are the outermost crossing cells. Any cell between these two outermost crossing cells that does not contain a point of the reference spectrum and/or the measured spectrum is a separating cell. The spectral space cells are used for the cell counting technique described in FIG. 9.

Depending on the location of the points of the measured spectrum and reference spectrum, each column can have one or more crossing cells, and the crossing cells of each column can be adjacent to each other or separated by separating cells.

If the maximum intensity MAX and the minimum intensity MIN are in the same cell, then there are no separating cells. Similarly, if the maximum intensity MAX and the minimum intensity MIN are in adjacent cells, then there are no separating cells in the column. For example, as shown in column of cells 490, the reference spectrum and the measured spectrum pass through adjacent cells. In this situation there is no separating cell in column 490.

It is also possible for separating cells to themselves be separated by crossing cells. For example, a column might contain, in vertical order, one or more crossing cells that include the first outermost cell, then one or more separating cells, then one or more crossing cells, then one or more separating cells, then one or more crossing cells that include the second outermost cell.

The separating cells can be enclosed with more than one crossing cell on the top or the bottom as shown in column 495 where there are 3 crossing cells. It is possible that, both the reference spectrum and the measured spectrum pass through the same cell, e.g., as shown in cell 485.

To determine a dissimilarity value which can be used in determining the best-matching reference spectrum, a ratio R can be calculated $$R=N2/(N1+N2)$$

where N1 is the total number of cells through which either the reference spectrum or the measured spectrum passes, and N2 is the number of cells that are between the reference spectrum and the measured spectrum (but through which the reference spectrum and the measured spectrum do no pass).

Figure 5A:
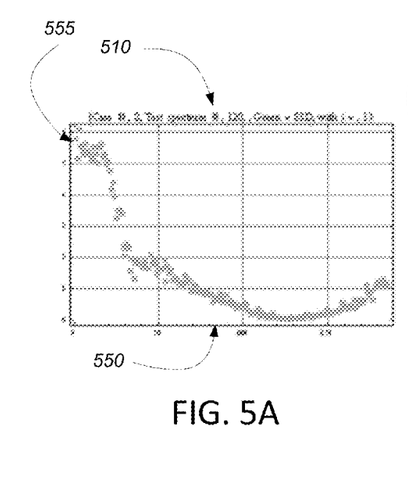
FIGS. 5A-5C illustrate the results of using different matching techniques.
Figure 5B:
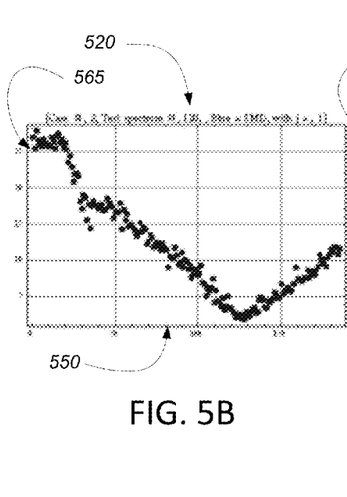
Figure 5C:
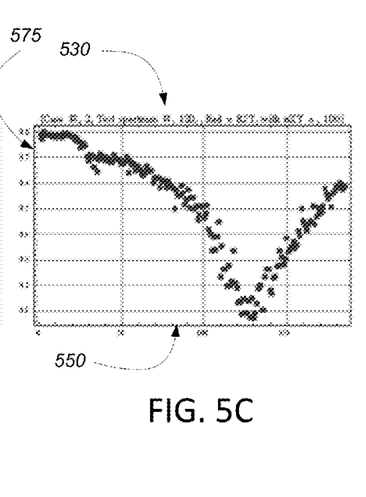

Referring to FIGS. 5A-5C, three scatter plots showing results of comparing a specific measured spectrum with the reference spectra from a spectral library 310 of FIG. 3 are displayed where the library 310 includes 200 reference spectra. Referring back to FIG. 5, each dot on the scatter plots 510-530 represents one reference spectrum where based on the vertical coordinates, the dots indicate a difference value between the measured spectrum and each reference spectrum. The horizontal coordinates 550 of the scatter plots show the reference spectra number. In the scatter plot 510 in FIG. 5A, the sum of squared differences (SSD) is used to find the difference of two spectra and the SSD values are shown on vertical coordinate 555, whereas the scatter plot 520 in FIG. 5B uses the sum of magnitude of differences (SMD) and SMD values are shown on the vertical coordinate 565.

For both the sum of squared differences in FIG. 5A and the sum of magnitude differences in FIG. 5B, there can be many spectra with close to the least difference. As a result, if there is noise or variation in the spectra due to variations in the underlying layers, the reference spectra with the least difference may actually not be a reliable indication of the thickness of the layer being polished.

Figure 9:
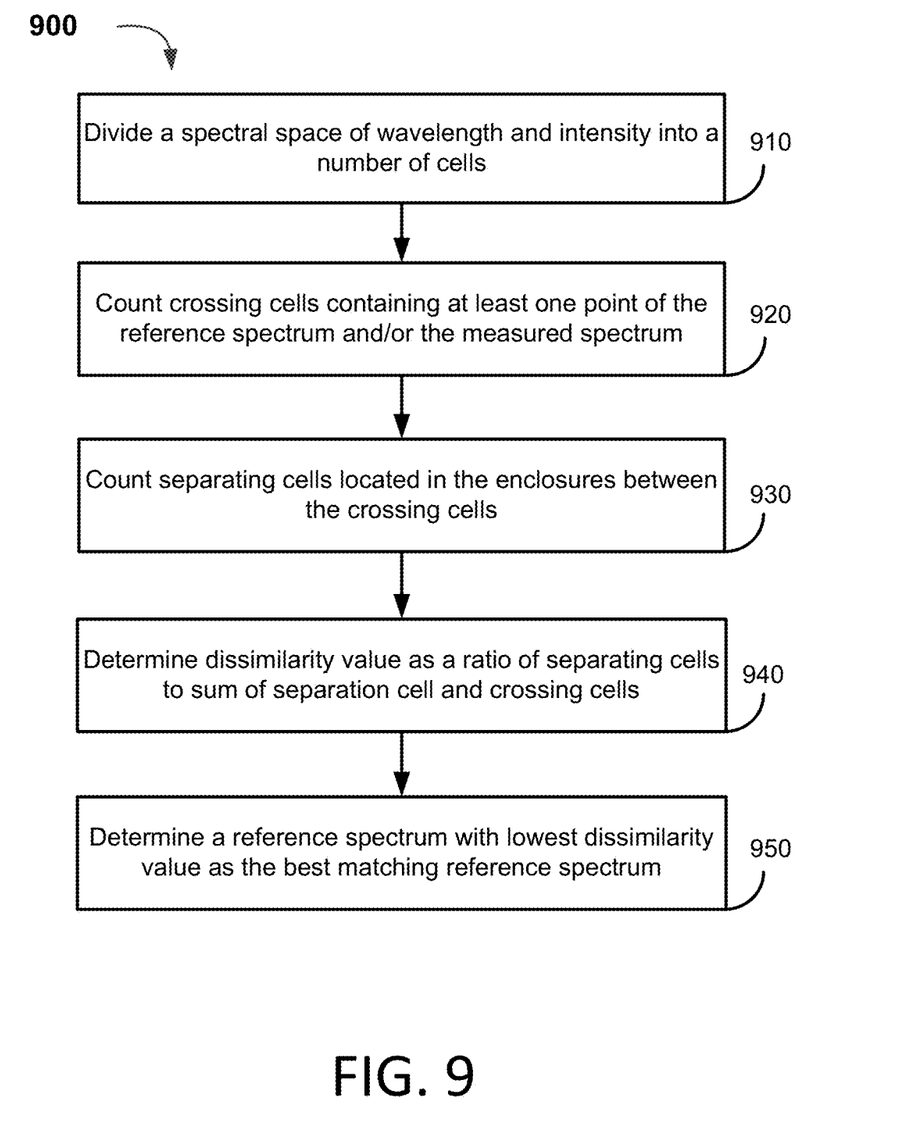
FIG. 9 is a flow graph of determining the best matching reference spectrum using the cell counting technique.

The scatter plot 530 in FIG. 5C uses a cell counting technique described in FIG. 9 based on the number crossing cells and the number of separating cells shown in FIG. 4 and finding a dissimilarity ratio. The dissimilarity ratio is shown on the vertical coordinate 575. The best matching reference spectrum is the one having the least difference, i.e., the lowest dissimilarity ratio, with the measured spectrum.

Comparing the scatter plots 510-530 of FIGS. 5A-5C, it is shown that the scatter plot 530 is sharper near its minimum and thus is a sharper metric for recognizing the matching spectrum. The sharper plot is less sensitive to small variation of the measurement spectrum, e.g., variation caused by measurement noise or the difference in underlying layers due to process variations.

Figure 6:
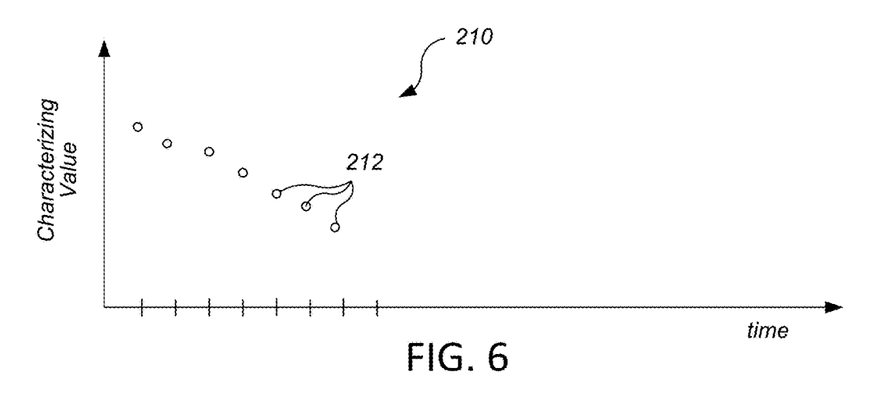
FIG. 6 illustrates an index trace.

Referring to FIG. 6, a time-varying sequence of characterizing values 212 related to polishing a substrate is illustrated. This sequence of characterizing values can be termed a trace 210. Each trace includes a sequence 210 of characterizing values 212, with each particular characterizing value 212 of the sequence being generated by selecting the characterizing value for the best matching reference spectrum. The time value for each characterizing value of the trace 210 can be the same as the time at which the measured spectrum was measured. In general, for a polishing system with a rotating platen, the trace 210 can include one, e.g., exactly one, characterizing value per sweep of the sensor of the optical monitoring system below the substrate. If multiple zones on a substrate are being monitored, then there can be one characterizing value per sweep per zone. Multiple measurements within a zone can be combined to generate a single characterizing value that is used for control of the endpoint and/or pressure. However, it is also possible for more than one characterizing value to be generated per sweep of the sensor.

Figure 7:
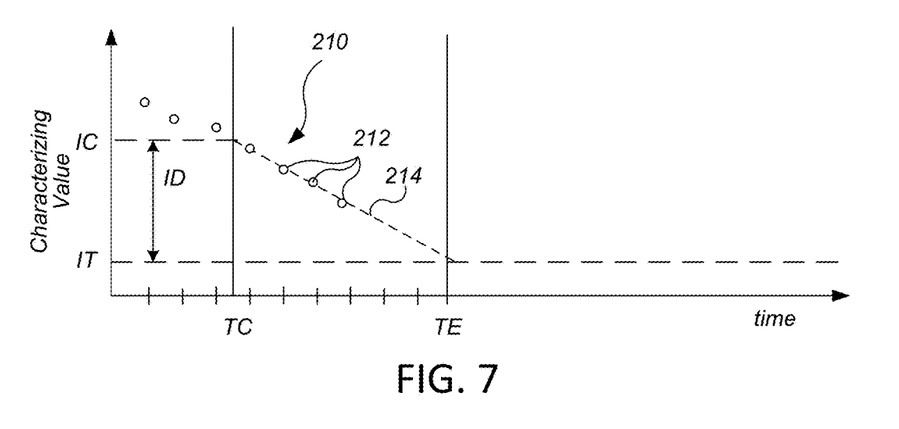
FIG. 7 illustrates an index trace having a linear function fit to characterizing values collected after clearance of an overlying layer is detected.

Referring to FIG. 7, a function 214 is fit to the time-varying sequence of characterizing values 212. For example, the function can be a polynomial function, e.g., a linear function. Other functions can be used, e.g., polynomial functions of second-order, but a line provides ease of computation. Polishing can be halted at an endpoint time TE that the line 214 crosses a target value IT. Optionally, the function 214 can be fit to the characterizing values collected after time a TC. Characterizing values collected before the time TC can ignored when fitting the function to the sequence of characterizing values. For example, this can assist in elimination of noise in the measured spectra that can occur early in the polishing process, or it can remove spectra measured during polishing of another layer. Polishing can be halted at an endpoint time TE that the function 214 equals a target value IT.

Figure 8:
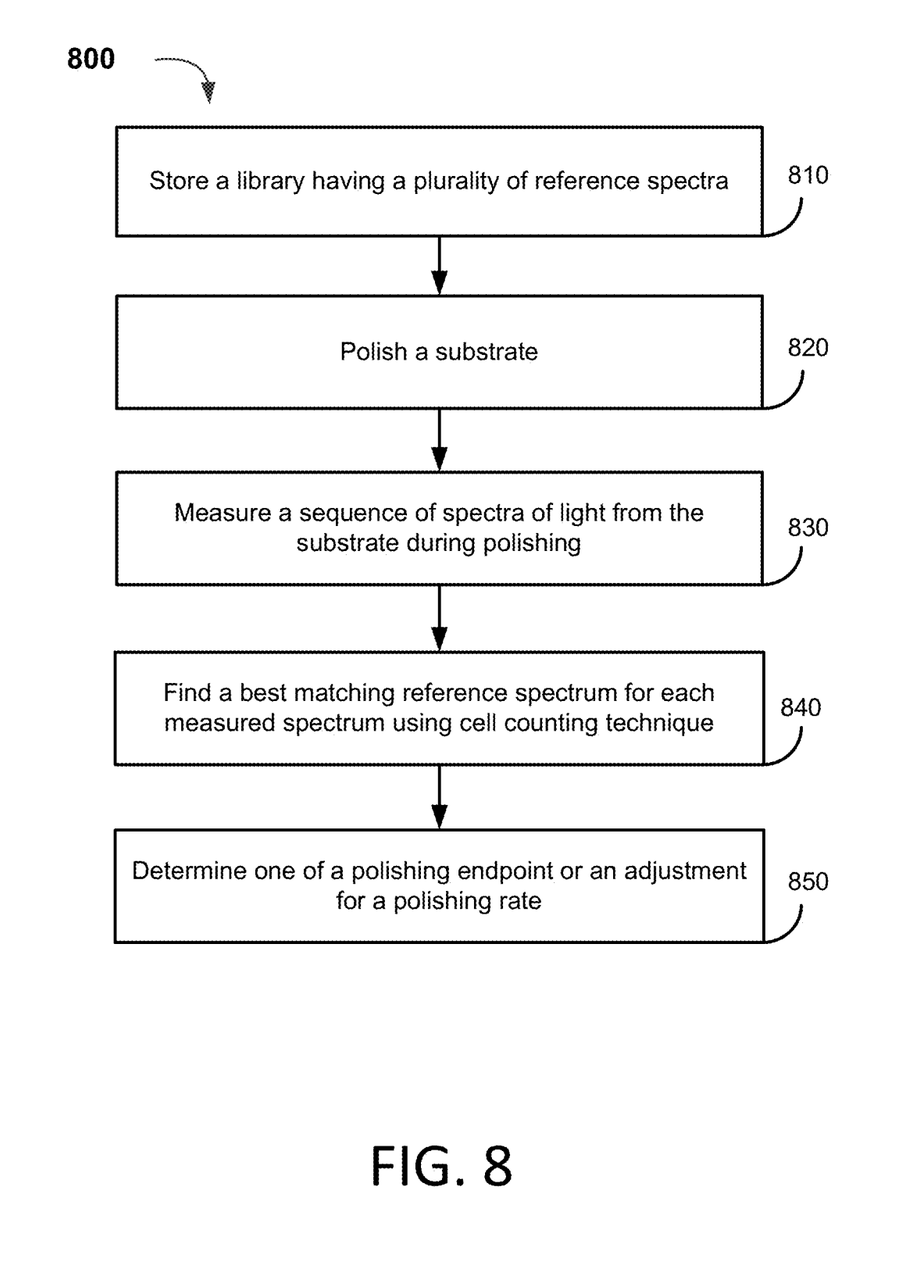
FIG. 8 is a flow graph for controlling a polishing operation of a product substrate.

FIG. 8 shows a flow graph of a method 800 for controlling a polishing operation of a product substrate. The controller stores a library of reference spectra (step 810). The reference spectra as shown in FIG. 3 can include one or more libraries of reference spectra where each library can be related to different underlying layers or pattern. The wafer is polished (step 820) for example with the polishing apparatus of FIG. 1 and a sequence of spectra is measured from the substrate under polish (step 830). Usually a broadband light is used for obtaining the measured spectrum.

A best matching reference spectrum is found for each measured spectrum (step 840). A cell counting technique is used for finding the best matched reference spectrum. The cell counting technique is described with respect to FIG. 9. Each best matching reference spectrum in the library can have an associated characterizing value indicating the thickness of the outer layer, the time, or a number of platen rotations at which the reference spectrum is expected to occur. By determining the associated characterizing value for each best matching reference spectrum, a time-varying sequence of characterizing values is generated. A polishing endpoint or an adjustment for a polishing rate is determined (step 840) based on the generated sequence of characterizing values. An example of finding a polishing endpoint is described in FIG. 7.

FIG. 9 shows a flow graph of a method 900 for determining the best matching reference spectrum to the measured spectrum using the cell counting technique. The spectral space of wavelength and intensity is divided into a number of cells (step 910). Dividing the spectral space into a number of cells can be performed as described above. The measured spectrum and the reference spectra can be normalized prior to matching. A wavelength range is selected such that all comparisons take place in the selected wavelength range. The cells cover the selected wavelength range and the entire normalized intensity range. Each cell covers a non-overlapping subrange of the selected wavelength and a non-overlapping subrange of intensity. The step of dividing the spectral space into cells is performed once.

Crossing cells are counted (step 920). The crossing cells are the cells that contain at least one point of the reference spectrum and/or measured spectrum. In other words, the wavelength width and intensity height of a crossing cell is such that at least one point of the reference spectrum and/or measured spectrum is contained in that cell. If the cell size is large, more than one point of the reference spectrum and/or measured spectrum can be in a single crossing cell. Each column can have one or more crossing cells. The crossing cells of each column can be adjacent to each other or separated by separating cells. For example, a column can have a first group of one or more crossing cells.

Separating cells are counted (step 930). Separating cells are the cell located in the enclosure between the measured spectrum and reference spectrum. The separating cells are limited from top and bottom by the crossing cells. It is possible that separating cell are limited by more than one crossing cell on the top or bottom. It is possible that a given column contains no separating cells.

The separating cells are calculated by searching the cells column by column for each wavelength subrange. In each column, the cells having a same wavelength subrange are searched and crossing cells are determined. The crossing cells contain a wavelength and intensity of at least one point of the reference spectrum and/or the measured spectrum. The cells between the crossing cells are designated as separating cell. As an example, there can be only one crossing cell in a column. In such case no separating cell exists for that column. As another example, there can be only adjacent crossing cells in a column. In such case no separating cell exists for the column.

In some implementations, cells that contain the points with the maximum intensity MAX and the minimum intensity MIN of all the points in the column provide outermost crossing cells. Any cell between these two outermost crossing cells that does not contain a point of the reference spectrum and/or the measured spectrum is a separating cell.

The separating cells of all columns are added to generate the total number of separating cells.

A dissimilarity value is determined (step 940). The total number of crossing cells is calculated. It is possible that a cell contains both measured spectrum and reference spectrum points as it is labeled as a crossing cell. In such cases the cell is counted only once in the total number of crossing cells. The dissimilarity value is calculated as the ratio of the number of separating cells to the sum of the numbers of crossing cells and separating cells. When a measured spectrum and reference spectrum get close to each other such that their points for every subrange of wavelength stay within a same cell or two adjacent cells, no separating cell exists and the dissimilarity ratio becomes zero.

The measured spectrum is compared with the reference spectra and a reference spectrum with the lowest dissimilarity value is determined as the best matching reference spectrum (step 950). The comparison is made with every spectrum of the reference spectra and a scatter plot such as 530 of FIG. 5C is generated. The comparison is made in the same order and therefore the scatter plot 530 follows a pattern showing a minimum where the measured spectrum and a reference spectrum become similar.

Due to process variations, the underlying composition of the measured spectrum can slightly be different from the underlying composition of the reference spectra. Additionally, there is measurement noise on top of that. Therefore, the scatter plot 530 shows some noisy features. As an example a curve can be fit to the portion of the scatter plot 530 near its minimum and the minimum of the fitted curve is determined. The reference spectrum closest to the minimum of the fitted curve is the best matching reference spectrum.

Figure 10:
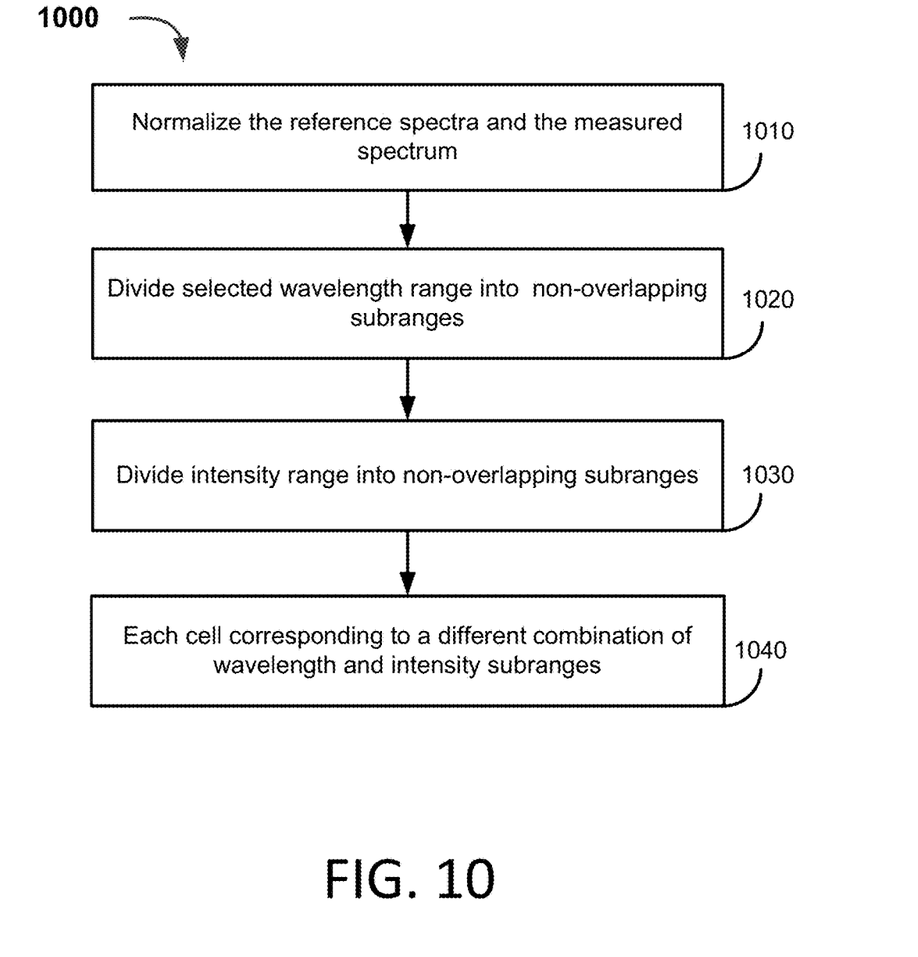
FIG. 10 is a flow graph of dividing the spectral space of wavelength and intensity into cells.

FIG. 10 shows a flow graph of a method 1000 for dividing the spectral space of wavelength and intensity into cells. The measured spectrum and the reference spectra are normalized (step 1010) such the measured spectrum intensity and the reference spectra intensities are limited to a range of minimum normalized intensity, e.g., zero, and maximum normalized intensity, e.g., one. The same normalization method is used for the measurement spectrum and the reference spectra.

The selected wavelength range is divided into a first number of non-overlapping subranges (step 1020). The number of wavelength subranges can be between 20 and 1000, e.g., 100. The width of the wavelength subranges can be equal and calculated as the width of the wavelength range divided by the first number of subranges. As an example, the width of the wavelength subranges can be different.

The selected intensity range is divided into a second number of non-overlapping subranges (step 1030). The number of intensity subranges can be between 20 and 1000, e.g., 100. The height of the intensity subranges can be equal and calculated as the distance between minimum normalized intensity and maximum normalized intensity divided by the second number of subranges. As an example, the height of the intensity subranges can be different.

Different combination of wavelength subranges and intensity subranges corresponds of a number of cells that cover the whole spectral space of selected wavelength and intensity (step 1040). The first number of subranges can be the same as the second number of subranges. As an example, the first number of subranges and the same as the second number of subranges can be different. The cells are non-overlapping, however, they can share some boundary lines. The boundary lines at the bottom and the left side of each cell are included in the cell whereas the boundary lines on top and at the right side of each cell are not included in the cell. The top most/right most cells have their top boundary lines/right side boundary lines included.

In some implementations, the sequence of values is used to adjust the polishing rate of one or more zones of a substrate, but another in-situ monitoring system or technique the sequence of values is used to detect the polishing endpoint.

In addition, although the discussion above assumes a rotating platen with a sensor of the in-situ monitoring system installed in the platen, the technique could also be applicable to in-sequence monitoring system for determining a best matching reference spectrum.

In addition, although the discussion above focuses on finding a best-matching reference spectrum from a plurality of reference spectra, this dissimilarity metric can be used when fitting an optical model to a measured spectrum.

The substrate can be at various stages of integrated circuit fabrication, e.g., the substrate can be a bare wafer, or it can include one or more deposited and/or patterned layers. The term substrate can include circular disks and rectangular sheets.

Embodiments of the invention and all of the functional operations described in this specification can be implemented in digital electronic circuitry, or in computer software, firmware, or hardware, including the structural means disclosed in this specification and structural equivalents thereof, or in combinations of them. Embodiments of the invention can be implemented as one or more computer program products, i.e., one or more computer programs tangibly embodied in a machine readable storage media, for execution by, or to control the operation of, data processing apparatus, e.g., a programmable processor, a computer, or multiple processors or computers. A computer program (also known as a program, software, software application, or code) can be written in any form of programming language, including compiled or interpreted languages, and it can be deployed in any form, including as a stand alone program or as a module, component, subroutine, or other unit suitable for use in a computing environment. A computer program does not necessarily correspond to a file. A program can be stored in a portion of a file that holds other programs or data, in a single file dedicated to the program in question, or in multiple coordinated files (e.g., files that store one or more modules, sub programs, or portions of code). A computer program can be deployed to be executed on one computer or on multiple computers at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Particular embodiments of the invention have been described. Other embodiments are within the scope of the following claims.

What is claimed is:

1. A method of controlling polishing, comprising:
storing a library having a plurality of reference spectra;
polishing a substrate;
measuring a sequence of spectra of light from the substrate during polishing;
for each measured spectrum of the sequence of spectra, finding a best matching reference spectrum from the plurality of reference spectra to generate a sequence of best matching reference spectra, wherein finding the best matching reference spectrum uses a cell counting technique that includes
dividing a spectra space into a plurality of non-overlapping cells with each cell corresponding to a different combination of a range of wavelengths and a range of intensities, and
counting cells located between cells through which the measured spectrum and a reference spectrum pass; and
determining at least one of a polishing endpoint or an adjustment for a polishing rate based on the sequence of best matching reference spectra.

2. The method of claim 1, wherein the cell counting technique comprises:
counting crossing cells, wherein a crossing cell contains at least one point of the reference spectrum and/or the measured spectrum;
counting separating cells, wherein separating cells are located in enclosures between the crossing cells;
determining a dissimilarity value, the dissimilarity value being a ratio of a number of separating cells to a sum of the number of separating cells and a number of crossing cells; and
finding a reference spectrum with a lowest dissimilarity value as the best matching reference spectrum.

3. The method of claim 2, wherein dividing the spectral space of wavelength and intensity into a number of cells comprises:
normalizing the reference spectra and the measured spectrum;
selecting a wavelength range, wherein the matching is performed in the selected wavelength range;
dividing the selected wavelength range into a first number of non-overlapping subranges;
dividing a normalized intensity range into a second number of non-overlapping subranges; and
each cell corresponding to a different combination of a subrange of the selected wavelength range from the first number of subranges and a subrange of the normalized intensity from the second number of subranges.

4. The method of claim 3, wherein counting the separating cells includes:
searching corresponding cells of each wavelength subrange of the first number of subranges and determining separating cells of each wavelength subrange, wherein the corresponding cells of each wavelength subrange are the cells having a same wavelength subrange, the search including:
determining one or more of the crossing cells of the wavelength subrange containing at least one point of the reference spectrum and/or the measured spectrum, and
designating the separating cells of the wavelength subrange, where the separating cells of the wavelength subrange are enclosed between the crossing cells, wherein there is at least one crossing cell above and at least one crossing cell below the separating cells.

5. The method of claim 2, wherein finding the best matching reference spectrum includes generating a sequence of dissimilarity values for the reference spectra and fitting a curve to the sequence of dissimilarity values and determining a minimum of the fitted curve, wherein a reference spectrum with a dissimilarity value closest to the minimum of the fitted curve is the best matching reference spectrum.

6. The method of claim 2, wherein each reference spectrum of the plurality of reference spectra has a stored associated characterizing value, and further comprising determining the associated characterizing value for each best matching spectrum from the sequence of best matching reference spectra to generate a sequence of characterizing values, and fitting a function to the sequence of characterizing values.

7. The method of claim 6, further comprising halting the polishing when the function matches or exceeds a target value.

8. The method of claim 2, wherein measuring the sequence of spectra of light from the substrate comprises making a plurality of sweeps of a sensor across the substrate.

9. The method of claim 8, wherein each spectrum from the sequence of spectra corresponds to a single sweep of the sensor from the plurality of sweeps.

10. A polishing apparatus, comprising:
a support to hold a polishing pad;
a carrier head to hold a substrate against the polishing pad;
a motor to generate relative motion between the carrier head and the support to polish the substrate;
an optical monitoring system to measure a sequence of spectra of light from the substrate while the substrate is being polished; and
a controller configured to
store a library having a plurality of reference spectra, each reference spectrum of the plurality of reference spectra having a stored associated characterizing value,
for each measured spectrum of the sequence of spectra, find a best matching reference spectrum using a cell counting technique that includes
dividing a spectra space into a plurality of non-overlapping cells with each cell corresponding to a different combination of a range of wavelengths and a range of intensities, and counting cells located between cells through which the measured spectrum and a reference spectrum pass; and determine at least one of a polishing endpoint or an adjustment for a polishing rate based on the sequence of best matching reference spectra.

11. The apparatus of claim 10, wherein the cell counting technique comprises:

counting crossing cells, wherein a crossing cell contains at least one point of the reference spectrum and/or the measured spectrum;

counting separating cells, wherein separating cells are located in enclosures between the crossing;

determining a dissimilarity value, the dissimilarity value being a ratio of a number of separating cells to a sum of the number of separating cells and a number of crossing cells; and finding a reference spectrum with a lowest dissimilarity value as the best matching reference spectrum.

12. The apparatus of claim 11, wherein dividing the spectral space of wavelength and intensity into a number of cells comprises:

normalizing the reference spectra and the measured spectrum;

selecting a wavelength range, wherein the matching is performed in the selected wavelength range;

dividing the selected wavelength range into a first number of non-overlapping subranges;

dividing a normalized intensity range into a second number of non-overlapping subranges; and each cell corresponding to a different combination of a subrange of the selected wavelength range from the first number of subranges and a subrange of the normalized intensity from the second number of subranges.

13. The apparatus of claim 12, wherein counting the separating cells includes:

searching corresponding cells of each wavelength subrange of the first number of subranges and determining separating cells of each wavelength subrange, wherein the corresponding cells of each wavelength subrange are the cells having a same wavelength subrange, the search including:

determining one or more of the crossing cells of the wavelength subrange containing at least one point of the reference spectrum and/or the measured spectrum, and designating the separating cells of the wavelength subrange, where the separating cells of the wavelength subrange are enclosed between the crossing cells, wherein there is at least one crossing cell above and at least one crossing cell below the separating cells.

14. A computer program product, tangibly embodied in a non-transitory machine readable storage media, comprising instructions to:

store a library having a plurality of reference spectra;
polish a substrate;
measure a sequence of spectra of light from the substrate during polishing;

for each measured spectrum of the sequence of spectra, find a best matching reference spectrum using a cell counting technique that includes dividing a spectra space into a plurality of non-overlapping cells with each cell corresponding to a different combination of a range of wavelengths and a range of intensities, and counting cells located between cells through which the measured spectrum and a reference spectrum pass; and determine at least one of a polishing endpoint or an adjustment for a polishing rate based on the sequence of best matching reference spectra.

15. The computer program product of claim 14, wherein the cell counting technique comprises:

counting crossing cells, wherein a crossing cell contains at least one point of the reference spectrum and/or the measured spectrum;

counting separating cells, wherein separating cells are located in enclosures between the crossing;

determining a dissimilarity value, the dissimilarity value being a ratio of a number of separating cells to a sum of the number of separating cells and a number of crossing cells; and finding a reference spectrum with a lowest dissimilarity value as the best matching reference spectrum.

16. The computer program product of claim 15, wherein dividing the spectral space of wavelength and intensity into a number of cells comprises:

normalizing the reference spectra and the measured spectrum;

selecting a wavelength range, wherein the matching is performed in the selected wavelength range;

dividing the selected wavelength range into a first number of non-overlapping subranges;

dividing a normalized intensity range into a second number of non-overlapping subranges; and each cell corresponding to a different combination of a subrange of the selected wavelength range from the first number of subranges and a subrange of the normalized intensity from the second number of subranges.

17. The computer program product of claim 16, wherein counting the separating cells includes:

searching corresponding cells of each wavelength subrange of the first number of subranges and determining separating cells of each wavelength subrange, wherein the corresponding cells of each wavelength subrange are the cells having a same wavelength subrange, the search including:

determining one or more of the crossing cells of the wavelength subrange containing at least one point of the reference spectrum and/or the measured spectrum, and designating the separating cells of the wavelength subrange, where the separating cells of the wavelength subrange are enclosed between the crossing cells, wherein there is at least one crossing cell above and at least one crossing cell below the separating cells.

18. The computer program product of claim 15, wherein finding the best matching reference spectrum includes generating a sequence of dissimilarity values for the reference spectra and fitting a curve to the sequence of dissimilarity values and determining a minimum of the fitted curve, wherein a reference spectrum with a dissimilarity value closest to the minimum of the fitted curve is the best matching reference spectrum.

* * * * *